US 6,580,403 B2

United States Patent
Lucas et al.

(10) Patent No.: US 6,580,403 B2
(45) Date of Patent: Jun. 17, 2003

(54) HOUSING FOR AN ELECTRONIC COMPONENT

(75) Inventors: Bernhard Lucas, Besigheim (DE); Andreas Kugler, Alfdorf (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/928,142

(22) Filed: Aug. 10, 2001

(65) Prior Publication Data

US 2002/0033745 A1 Mar. 21, 2002

(30) Foreign Application Priority Data

Aug. 10, 2000 (DE) .......................... 100 38 999

(51) Int. Cl.[7] .................. H01Q 1/42; H02G 3/14
(52) U.S. Cl. .................. 343/872; 174/66; 220/516
(58) Field of Search .................. 343/872, 700 MS, 343/789, 907, 916; 174/66, 67, 250; 220/3.8, 241, 242, 516; H01Q 1/42; H02G 3/14; B65D 1/36

(56) References Cited

U.S. PATENT DOCUMENTS

| | | | |
|---|---|---|---|
| 4,728,962 A | * | 3/1988 | Kitsuda et al. ...... 343/700 MS |
| 4,914,448 A | * | 4/1990 | Otsuka et al. ....... 343/700 MS |
| 4,914,449 A | * | 4/1990 | Fukuzawa et al. .......... 343/872 |
| 5,619,217 A | * | 4/1997 | Mailandt et al. ............ 343/872 |
| 5,828,339 A | * | 10/1998 | Patel ................... 343/700 MS |
| 6,037,903 A | * | 3/2000 | Lange et al. ......... 343/700 MS |
| 6,246,381 B1 | * | 6/2001 | VandenDolder et al. ...... 29/600 |
| 6,271,471 B1 | * | 8/2001 | Leiter et al. ................... 174/66 |
| 6,421,011 B1 | * | 7/2002 | Van Egmond et al. ...... 343/700 MS |

FOREIGN PATENT DOCUMENTS

DE 198 56 332 6/2000 ........... H01L/23/48

* cited by examiner

Primary Examiner—Don Wong
Assistant Examiner—Trinh Vo Dinh
(74) Attorney, Agent, or Firm—Kenyon & Kenyon

(57) ABSTRACT

A housing for an electronic component is described, in particular a Gunn element for generating radar waves, including a bottom part, a wall part made of a plastic that can be processed by injection molding in particular and a cover part enclosing the electronic component in the installed state. The cover part has a contact spring for establishing an electric connection to a terminal of the component. In addition, the wall part is connected to the cover part by at least one connecting structure.

6 Claims, 4 Drawing Sheets

HOUSING FOR AN ELECTRONIC COMPONENT

FIELD OF THE INVENTION

The present invention relates to a housing for an electronic component, in particular for a Gunn element (Gunn oscillator) for generating radar waves.

BACKGROUND INFORMATION

Radar waves having frequencies above 50 gigahertz generated by Gunn elements are used for collision avoidance radar units for motor vehicles (ACC=adaptive cruise control).

Therefore, German Published Patent Application No. 198 56 332 has already proposed a housing for such a Gunn element having a bottom part, a wall part and a cover part to enclose the electronic components. The cover part has a contact spring for producing an electronic connection to a terminal of the electronic component, the cover part and contact spring being made of one piece according to German Published Patent Application No. 198 56 332.

A Gunn element in such a housing typically has a diameter of approx. 70 micrometers and a thickness of approx. 10 micrometers, and it can be contacted electrically on the top and bottom sides.

The wall part of the housing according to German Published Patent Application No. 198 56 332 is made of ceramic. Connection of the wall part to the cover part is implemented by gluing or soldering, for example.

SUMMARY OF THE INVENTION

The housing according to the present invention for an electronic component, in particular a Gunn element, has the advantage over the related art that the wall part, made of plastic, can be integrally molded onto the cover part immediately after its production. This integral molding of the wall part by the injection molding technology can be performed on cover parts that have already been separated or, as an alternative, on cover parts that have been joined to a metal wafer or an intermediate carrier used to produce the cover parts. To this extent, the connection of the cover part to the wall part can also be advantageously established even at the wafer level in multiple use.

Due to the injection molding technology used for joining the plastic wall part to the cover part with the help of a connecting structure, the mechanical connection of the wall part to the cover part can also be adapted advantageously to the given requirements of each individual case to ensure that mechanical forces acting upon the housing are always absorbed and/or diverted in such a way that the connection of the wall part to the cover part is not destroyed.

Due to the plastic wall part and the connecting structure between the wall part and the cover part, inexpensive manufacture of the housing for an electronic component by the injection molding technology with low manufacturing tolerances is also guaranteed even in mass production.

Finally, it is advantageous that an assembly step is eliminated in assembly of the housing due to the connecting structure between the wall part and the cover part, because soldering or gluing of the cover part to the wall part can be omitted.

Thus, on the whole, the housing according to the present invention has the advantage of simple and reliable contacting of the electronic component, so that this housing is suitable in particular for mass production of Gunn elements for generating radar waves in a collision avoidance radar unit in motor vehicles.

Thus, it is especially advantageous if the wall part is made of a plastic that can be processed by the injection molding technology and is stable up to temperatures of at least 120 degrees Celsius. The choice of plastic as the material for the wall component also has the advantage that the resonant frequency of the Gunn element can be influenced or adjusted via its dielectric constant.

The connecting structure between the wall part and the cover part is advantageously implemented in the form of denticulation on the wall part and the cover part.

DETAILED DESCRIPTION

The present invention is based first on a housing for an electronic component such as that already known in a similar form from German Published Patent Application No. 198 56 332. In principle, FIGS. 1 through 3 in particular are also known from this patent application, but the housing for an electronic component described there has been modified here with regard to the material of wall part 4 and with regard to the connection of wall part 4 to cover part 22.

Figure 1:
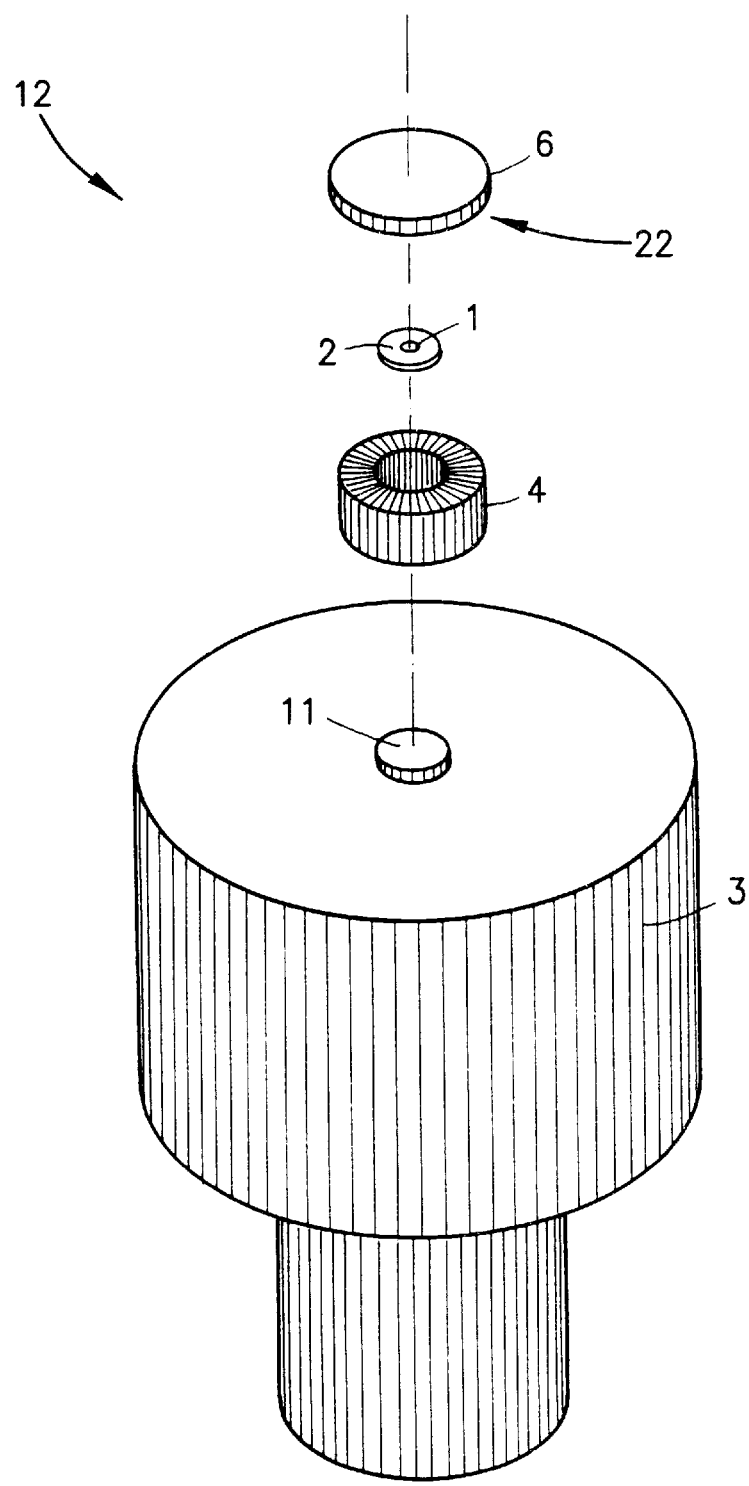
FIG. 1 shows a housing for an electronic component having an integrated component.

In detail, FIG. 1 shows a housing 12 for an electronic component 1, electronic component 1 being designed in the form of a Gunn element for generating radar waves. FIG. 1 also shows how housing 12 sits on a bottom part 3 made of copper. The function of bottom part 3 is to dissipate heat and provide electric contact for electronic component 1. Housing 12 also has a centering disk 11 made of a conductive material on which electronic component 1 rests. Electronic component 1 is connected to centering disk 11 by a disk 2, which is known as a heat sink, having a metallic connection using gold. The function of disk 2, centering disk 11 and bottom part 3 is to supply electric current to a lower contact of component 1 as well as to dissipate heat. In addition, according to FIG. 1, wall part 4 is designed in the form of a plastic ring which is centered by centering disk 11. According to FIG. 1, housing 12 is sealed by cover part 22, which is designed in one piece and has a covering part 6 in the form of a disk.

Figure 2:
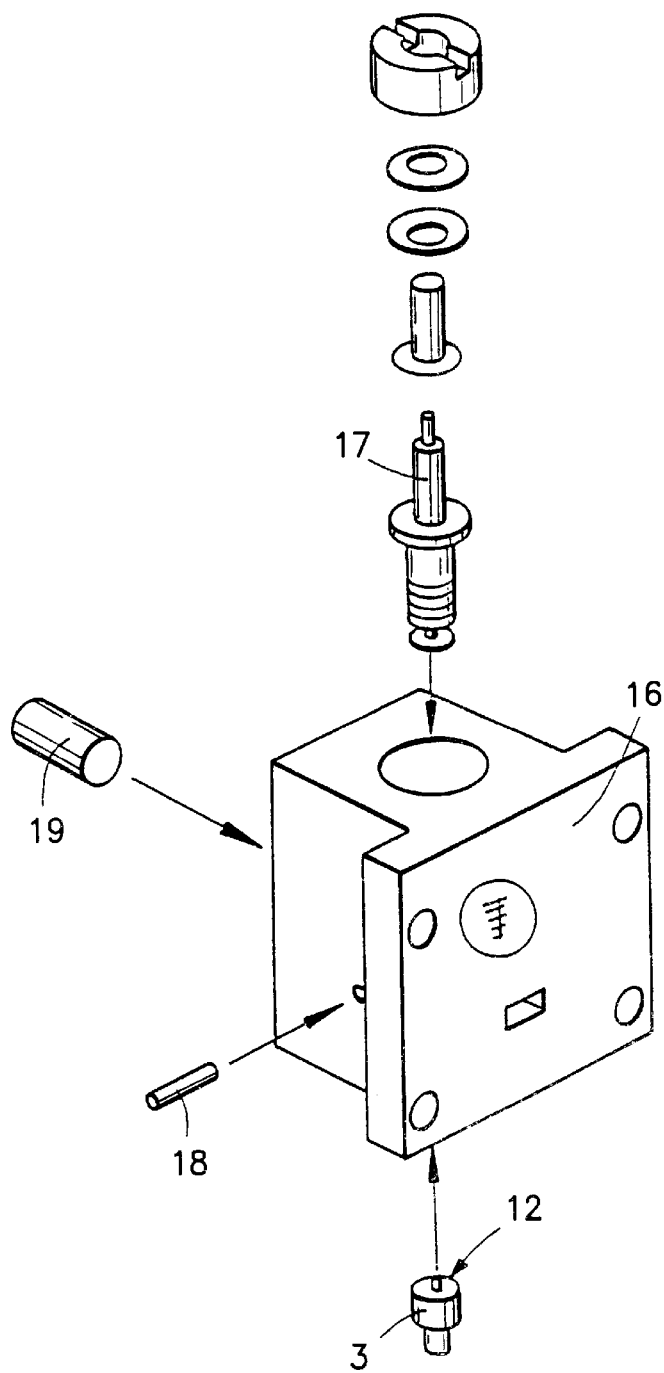
FIG. 2 shows a Gunn oscillator for a collision avoidance radar unit having a housing with an integrated component according to FIG. 1.

The typical design of a Gunn oscillator having bottom part 3 and housing 12 having an integrated component 1 according to FIG. 1 is shown in an exploded diagram in FIG. 2.

FIG. 2 shows an oscillator block 16 having an integrated square-wave waveguide in which housing 12 having an integrated component 1 is accommodated and is contacted with HF restrictor plate and resonator disk by a d.c. voltage supply 17. In addition, a frequency tuning pin 18 for frequency tuning and a waveguide short-circuit slide 19 for power control are also provided.

Figure 3:
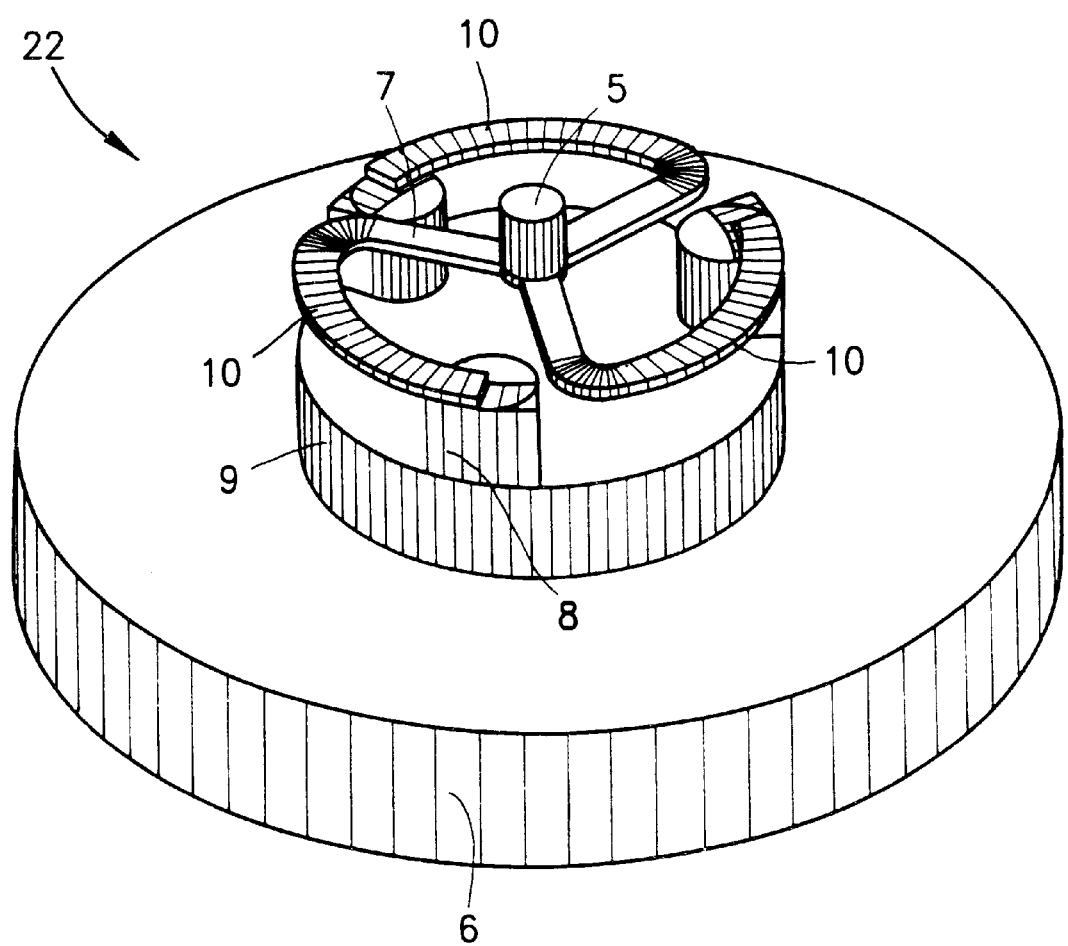
FIG. 3 shows a cover part according to FIG. 1.

FIG. 3 illustrates cover part 22 according to FIG. 1 in greater detail. Specifically, FIG. 3 shows that cover part 22 has on its inside a base part 9 in the form of a disk connected to covering part 6. In addition, cover part 22 has columns 8 connected to base part 9 and spring arms 10. Spring arms 10 here form a contact spring 7 which has at its center a contact ram 5 made of gold, for example. This contact ram 5 is used for electric contacting of the top side of electronic component 1 according to FIG. 1 or FIG. 4. It should be emphasized here in particular that cover part 22 is made in one piece together with covering part 6, base part 9, column 8, contact spring 7 and contact ram 5, so that a self-adjusting joining operation is possible in assembly of cover part 22 with wall part 4.

Reference is made to German Published Patent Application No. 198 56 332 with regard to additional details concerning the manufacturing and structural details of cover part 22.

Figure 4:
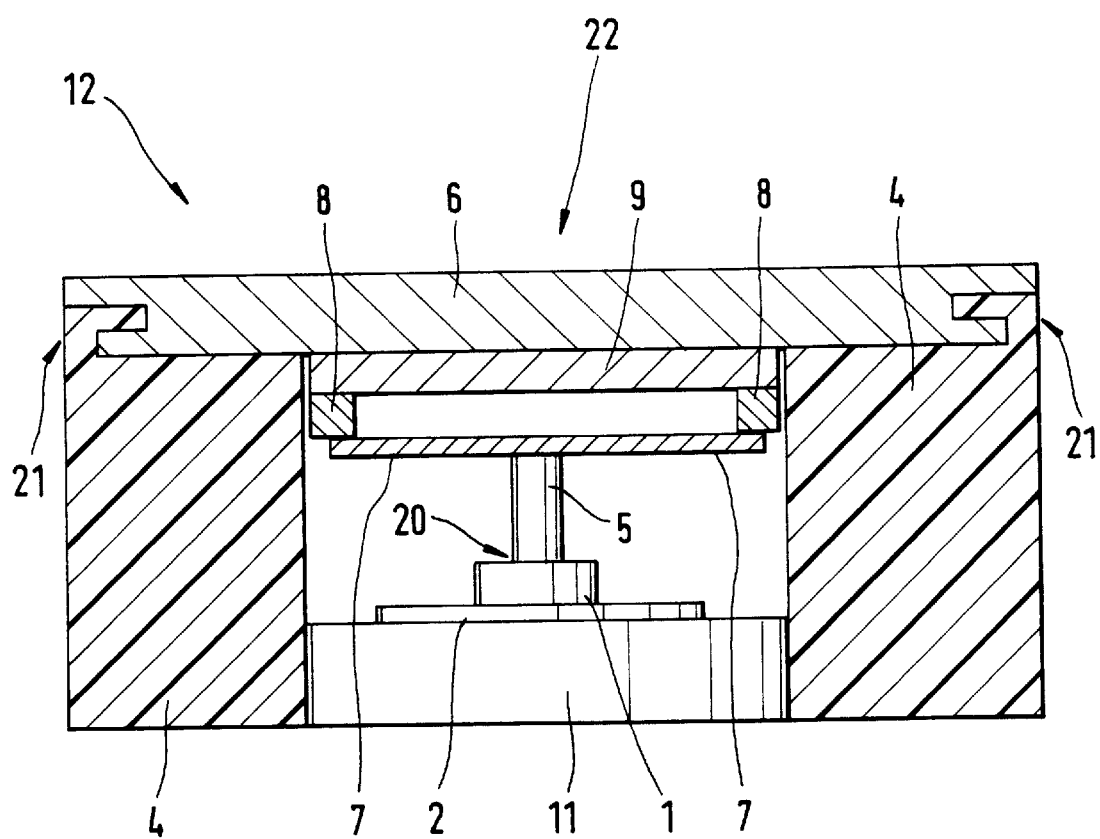
FIG. 4 shows a sectional view of the housing having the integrated component according to FIG. 1.

FIG. 4 shows a sectional view of housing 12 having integrated component 1, which is arranged on bottom part 3 (not shown) according to FIG. 1. Wall part 4 is composed of a ring of plastic that can be processed and molded by the injection molding technology and is stable at temperatures up to at least 120° C. The choice of this plastic is preferably made such that its dielectric constant is adapted to the frequency of the radar waves generated by the Gunn element or component 1.

The plastic for producing wall part 4 is PEI, TPX or PC, for example.

FIG. 4 also shows that on its top side facing contact ram 5 electronic component 1 has contact metallizing 20 which improves the electric contact. Finally, FIG. 4 shows that wall part 4 is connected to cover part 22 by a connecting structure 21. This connecting structure 21 is designed in the form of peripheral denticulation in the embodiment described here.

The connection of wall part 4 and the cover part 22 is achieved by the fact that wall part 4 is integrally molded on cover part 22 by the injection molding technology immediately after the production of the latter part. Such integral molding can be performed either on cover part 22, which has already been separated, or as an alternative, by integral molding of wall parts 4 onto cover parts 22 which are on a metal wafer or an intermediate carrier.

Reference is made to German Published Patent Application No. 198 56 332 for additional details regarding the design and functioning of housing 12, cover part 22 or electronic component 1 in the form of a Gunn element.

What is claimed is:

1. A housing for an electronic component, comprising:
   a bottom part;
   a wall part;
   at least one connecting structure; and
   a cover part that encloses the electronic component in an isolated state and is connected to the wall part by the at least one connecting structure, wherein:
   the cover part includes a contact spring for establishing an electric connection to a terminal of the electronic component,
   the wall part is integrally molded on the cover part to form one piece, and the wall part is made of a plastic.

2. The housing according to claim 1, wherein:
   the wall part is molded and processed by an injection molding operation.

3. The housing according to claim 1, wherein:
   the plastic is stable up to a temperature of at least 120° C.

4. The housing according to claim 1, wherein:
   the electronic component includes a Gunn element for generating a radar wave.

5. The housing according to claim 1, wherein:
   a resonant frequency of the Gunn element is influenced by a dielectric constant of the plastic.

6. The housing according to claim 1, wherein:
   the at least one connecting structure includes a denticulation on the cover part and the wall part.

* * * * *